United States Patent [19]

Bailey et al.

[11] Patent Number: 5,744,232
[45] Date of Patent: Apr. 28, 1998

[54] LOW LOSS, THICK FILM METALLIZATIONS FOR MULTILAYER MICROWAVE PACKAGING

[75] Inventors: Alex Bailey, Hampstead; Andrew J. Piloto, Columbia, both of Md.; Deborah P. Partlow, Export, Pa.

[73] Assignee: Northrop Grumman Corporation, Los Angeles, Calif.

[21] Appl. No.: 680,260

[22] Filed: Jul. 11, 1996

[51] Int. Cl.⁶ .................................................... B23B 5/16
[52] U.S. Cl. ........................... 428/323; 428/328; 428/329
[58] Field of Search ................................ 428/323, 328, 428/329

[56] References Cited

U.S. PATENT DOCUMENTS

| | | | |
|---|---|---|---|
| 4,215,170 | 7/1980 | Vilaprinyo Oliv | 428/328 |
| 4,663,240 | 5/1987 | Hajdu et al. | 428/545 |
| 4,940,849 | 7/1990 | Morris et al. | 428/209 |
| 5,002,826 | 3/1991 | Pollart et al. | 428/323 |
| 5,021,293 | 6/1991 | Huang et al. | 428/328 |
| 5,175,031 | 12/1992 | Ochocki | 428/34.2 |
| 5,225,287 | 7/1993 | Perry et al. | 428/458 |

*Primary Examiner*—H. Thi Le
*Attorney, Agent, or Firm*—Walter G. Sutcliff

[57] ABSTRACT

A thick film metallization compatible with low temperature cofired ceramics (LTCC) that displays very low microwave insertion losses commensurate with those of thin film gold. However, the disclosed metallization is applied similar to conventional metallizations by screen printing and has no limit to the number of layers achievable. The electrical performance of the metallization is attained by using a spherical metal particle shape and uniform particle size distribution in the thick film paste. The advantage of this invention is that superior microwave performance can be achieved in electronic packages without the cost and limitations imposed by thin film metallization techniques.

11 Claims, 3 Drawing Sheets

| INGREDIENT | 76C | 76B | 77C | 77A | 120D |
|---|---|---|---|---|---|
| SPHERICAL GOLD | 84.06 | 75.73 | 82.38 | 86.36 | 84.77 |
| $Cu_2O$ | 0.11 | 0.00 | 0.00 | 0.00 | 0.11 |
| $Bi_2O_3$ | 1.10 | 0.00 | 0.00 | 0.00 | 1.10 |
| RHODIUM COMPLEX | 0.04 | 0.00 | 0.00 | 0.00 | 0.04 |
| STABILIZER | 0.22 | 0.20 | 0.09 | 0.10 | 0.00 |
| PHOSPHATE WETTING AGENT | 0.55 | 0.41 | 0.92 | 0.00 | 0.00 |
| ETHYL CELLULOSE IN TERPINEOL | 13.66 | 23.66 | 0.00 | 0.00 | 0.00 |
| ETHYL CELLULOSE IN TEXANOL & DIBUTYLPHTHALATE | 0.26 | 0.00 | 4.66 | 5.41 | 0.00 |
| ETHYLHYDROXYETHYLCELLULOSE IN ISOPAR L & H AND DODECANOL | 0.00 | 0.00 | 0.00 | 0.00 | 13.98 |
| TERPINEOL | 0.00 | 0.00 | 0.46 | 0.00 | 0.00 |
| DECOMPOSABLE ORGANIC FILLER | 0.00 | 0.00 | 6.64 | 6.59 | 0.00 |
| QUARTZ | 0.00 | 0.00 | 6.64 | 4.61 | 0.00 |

*FIG. 3*

LOW LOSS, THICK FILM METALLIZATIONS FOR MULTILAYER MICROWAVE PACKAGING

BACKGROUND OF THE INVENTION

1. Field of the Invention

This invention relates generally to multilayer packages for microwave electronics and more particularly to metallization techniques for use in such multilayer packages.

2. Description of the Prior Art

Multilayer ceramic (MLC) packages for advanced electronics are often used in applications requiring light weight and small volume. The ceramic can simply serve as the substrate on which semiconductor devices are mounted and electrically connected to one another. Multiple substrates populated with devices can then be placed in a metal housing to build a complete module. Alternatively, a ceramic package can actually form the housing for the entire electronic module. In this case, the semiconductor devices can be mounted in recessed cavities that are fabricated in the MLC, and a lid can be attached to the top perimeter of the MLC, forming an hermetically sealed package.

Whether the ceramic is used as a substrate only or whether it also serves as the housing, complex 3-dimensional networks of metal electrical lines and connections convey the signal to and among the semiconductor devices. When properly configured, these metal interconnects also condition the signal, functioning as transformers, etc. The metal network runs horizontally between the layers of ceramic and vertically through metal-filled holes called vias.

As one might expect, the electrical properties of the metal interconnects can have an effect on the performance of the electronic module. The metal is usually applied as a thick film paste that is screen printed onto each layer of ceramic prior to heating. The temperature at which the ceramic must be heated to complete densification will determine which metals can be used in the buried conductor paths, which are cofired with the ceramic. For ceramics that densify at high temperatures, i.e., 1600° C., comparatively resistive metals such as tungsten and molybdenum must be used for cofiring, because these metals have high melting points and will withstand such temperatures without losing definition.

If necessary, a top layer of more conductive metallization such as gold or silver can be applied on the exposed surface of the ceramic after it has been densified at high temperatures, and then the assembly is reheated to less than 1000° C. to sinter the metal. This is referred to as post-firing. Another option is to apply the top conductor as a thin film of highly conductive metal using a vapor deposition process such as sputtering.

The advent of a new line of lower-temperature firing electronic ceramic packaging materials has permitted the use of high-conductivity metal thick film pastes that can be cofired with ceramics. These metals include gold, silver, and copper. Cofiring temperatures of approximately 800° to 1000° C. are used in these lower-firing systems, called LTCC (Low Temperature Cofired Ceramics). Even so, thin film remains as the metallization exhibiting the lowest microwave insertion loss, for reasons explained below.

Thin film metal is deposited from the metallic vapor state. The metallization in this case is pure metal. In order to promote adhesion, typically a multilayer stack of several metals is deposited onto a substrate. The insertion loss properties of this type of metallization are significantly superior to those of thick film metallization as shown in FIG. 1. The metallizations of FIG. 1 were each measured on the same type of substrate, i.e., one having a dielectric constant, $\epsilon_r$, of 3.8 and a loss tangent, $\mathrm{Tan}^\delta$, of 0.0007.

Thin film metallization techniques typically result in insertion losses in the approximate amount of 0.15 dB/inch while typical thick film metallization techniques typically result in insertion losses in the range of 0.25 to 0.5 dB/inch.

However, thin film metallization has the disadvantage of being expensive to apply; and for practical purposes it is normally used only on the top surface of the MLC. On the other hand, thin film metallization has the advantage of being pure metal, and therefore displays superior electrical properties compared to those of the paste-based metals, which contain powdered glass particles called glass frit along with metal particles to help with adhesion of the metal to the ceramic. The glass frit in thick film metal pastes contributes to microwave insertion losses when the metallization is used as a microwave transmission medium.

The thin film 12 which is charted in FIG. 1 is pure gold that is vapor deposited in a vacuum system. The thin film 12 is the lowest loss that can be achieved in a gold conductor line that is applied on a ceramic substrate. The Ferro fritted cofired metallization 14 is a gold metallization sold commercially by Ferro Corporation. The metallization 14 is a thick film paste that is screen-printed on the ceramic. The Ferro fritted cofired metallization 14 contains glass frit (powdered glass) particles to help the gold adhere to the ceramic. "Cofired" refers to the fact that the paste was screen printed on the unfired ceramic, and then the ceramic and the gold paste were both fired together. The Ferro fritted post-fired metallization 16 is similar to the Ferro fritted cofired metallization 16 except that the ceramic of the Ferro fritted postfired metallization 16 is fired by itself first, then the gold paste is screen printed on the fired ceramic, and the piece is fired again to densify the gold paste. The DuPont fritless cofired 18 and postfired 20 metallizations are gold metallizations that are sold commercially by DuPont. These metallizations 18, 20 are also thick film pastes that are screen printed on the ceramic. These metallizations 18, 20 do not contain glass frit. Again, "cofired" refers to the fact that the paste is screen printed on an unfired ceramic and then the ceramic and paste are fired together, while "postfired" means that the ceramic is fired alone and then the paste is applied and the piece is fired again to densify the paste.

Conventional metallization consists of the following: metal particles: either flakes or spheroids (no particular particle size distribution); glass frit: optional usage of either copper oxide, bismuth oxide or component glass ceramic oxides; and organic binders and vehicles.

Each of these components is mixed in a given proportion to provide a paste of a given viscosity suitable for a screen printing operation. The best insertion loss properties of these materials are shown in FIG. 1 over a range of microwave frequencies.

Metallization of the prior art typically utilizes particles that are shaped like rough, uneven flakes. When the flakes are deposited by screen printing, they stack to a degree but, since they are all different shapes and sizes, they protrude, resulting in a much rougher surface in the unfired final state. Since the ceramic and the metal are fired together at temperatures well below the melting point of the metal, the irregular surface of the metal is not melted and smoothed out. To the extent that some prior art metal particles may have had a generally spherical shape, they have no particular size distribution. That means that if randomly sized spheres are deposited, the density of the deposited layer cannot be optimized. The uniform particle size and spherical shape allows for the densest, most closely packed arrangement. Spaces between particles result in pores in the deposited metal. The pores represent a deviation from a flat surface, thus the more pores are present and the more irregular the particles are in shape and size, the rougher the metallization surface will be. Therefore, the lower density of a given material, the rougher the surface will be by virtue of the pores and their shape and their size. Internal pores also are deleterious to the conductivity of the metal, since they act as a resistive component.

It would therefore be advantageous to develop thick film metallization with microwave insertion loss properties similar to those of thin film metallization.

SUMMARY OF THE INVENTION

We provide a thick film metallization for use in microwave devices which exhibits microwave insertion loss properties similar to those of thin film metallization. The preferred metallization is made of monosized, spherical metal particles having diameters of between 0.3 and 10 microns and having an average diameter of approximately 1.5 microns.

The preferred metallization is made of spherical particles in an organic vehicle, in which the spherical particles are almost all the same size, i.e., having a narrow particle size distribution. Thus, when the metal paste is screen printed, the spherical particles can settle into a very close packed geometry leaving very little space between particles. Thus, after the organic vehicles, solvent and other paste components are fired out of the paste, the density of the screen printed metal is very good and also the surface is very smooth. Those properties result in little or no resistivity, i.e., high conductivity.

The metallization is preferably applied to the microwave device as a thick film paste. The thick film paste is preferably applied to the microwave device by screen printing techniques. One or more adhesion-promoting additives may be included in the metallization. The thick film paste contains a selected combination of additives that are selected to provide a viscosity suitable for screen printing and to modify shrinkage behavior of the paste.

Preferably, the metal particles are made of one or more of the following: gold, silver, copper, palladium, platinum, nickel and alloys of any of these metals. It is further preferred that the combination of binders, stabilizers, wetting agents, solvents and fillers are selected so that the metallization densifies at temperatures below 1000° C.

Other objects and advantages of the invention will become apparent from a description of certain present preferred embodiments thereof shown in the drawings.

BRIEF DESCRIPTION OF THE DRAWINGS

FIG. 3 is a chart showing the percentage compositional breakdown of a number of different metallization compositions.

DETAILED DESCRIPTION OF THE PREFERRED EMBODIMENT

Using conventional thick film organic materials as vehicles and binders, thick film metallization can exhibit low microwave insertion loss. To achieve low insertion losses, a present preferred metallization is made of monosized, spherical metal particles in an organic vehicle.

Figure 1:
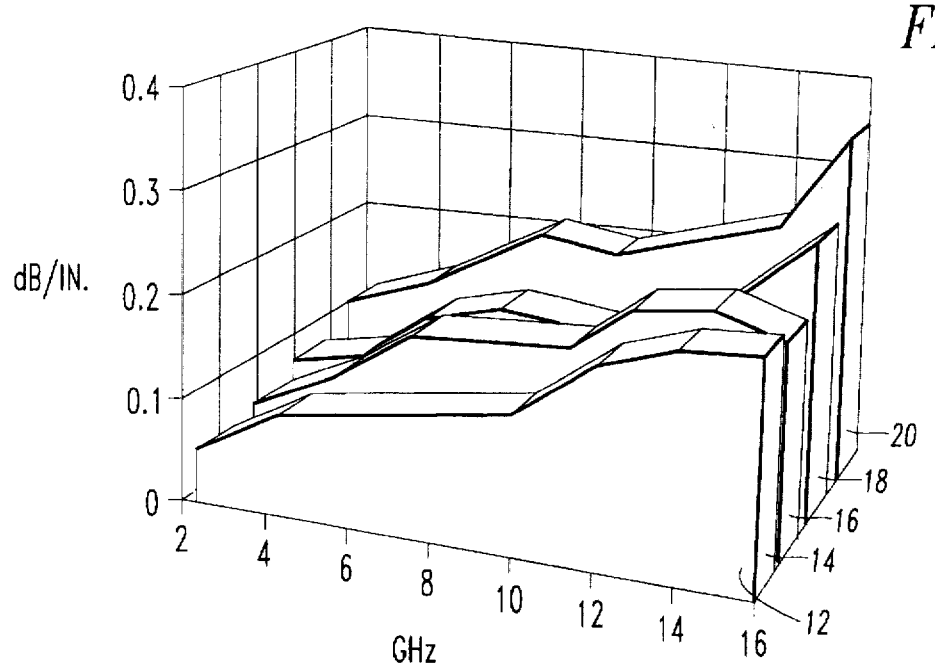
FIG. 1 is a graphical representation of insertion loss versus frequency for a number of metallization materials, each applied on the same ceramic substrate for a fair comparison.
Figure 2:
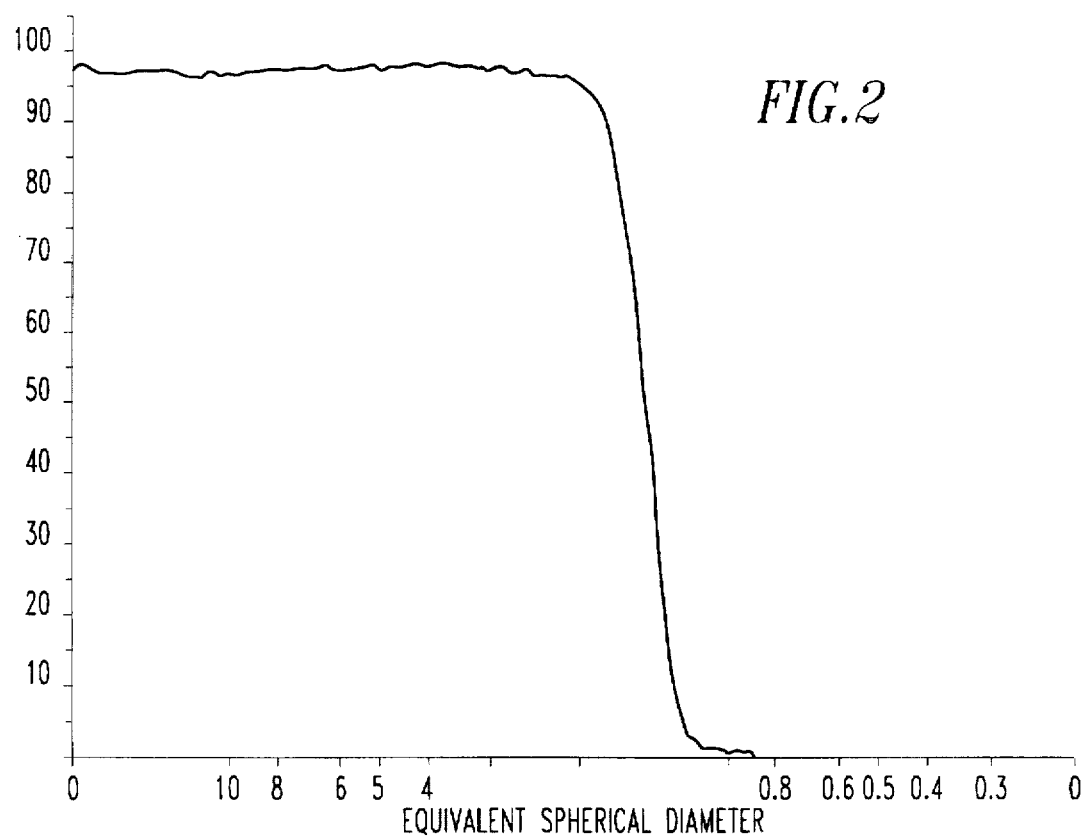
FIG. 2 is a graphical representation of spherical diameter in microns versus percentage of particles having a diameter smaller than the indicated diameter.

The preferred metallization is made of spherical particles that are relatively uniform in size, i.e., having a narrow particle size distribution. The metal particles used in the metallization preferably have diameters of between 0.3 and 10 microns. The preferred average diameter the metal particles of the metallization is approximately 1.5 microns. The key to this development is the particle size distribution and shape of the metal particles in the thick film. With monosized, spherical metal particles and a very narrow distribution in particle size (shown in FIG. 2) for 1.5 micron spheres, microwave insertion losses can be reduced to within 15% of the insertion losses of thin film metallization.

With the size distribution and shape of the particles, when the metal paste is screen printed, the spherical particles can settle into a very close packed geometry leaving very little space between particles. Thus, after the organic vehicles, solvent and other paste components are fired out of the paste, the density of the screen printed metal is relatively high and the surface is relatively smooth. The high density and smooth surface of the metallization results in little or no resistivity, i.e., high conductivity. The resulting smooth surface and smooth edge definition approximates a wire and the best transmission properties are obtained when the interface between the metal and ceramic is smooth and when the interface between the metal and the air is smooth.

The metallization is preferably applied to the microwave device as a thick film paste. Screen printing techniques are the preferred manner of applying the thick film pulse to the microwave device. One or more adhesion-promoting additives may be included in the metallization. These additives include copper oxide, bismuth oxide, rhodium and ceramic substrate constituents. The thick film paste contains a selected combination of organic binders, stabilizers, wetting agents, solvents, and decomposable organic fillers that are selected to provide a viscosity suitable for screen printing and to modify shrinkage behavior of the paste.

Preferably, the metal particles are made of one or more of the following: gold, silver, copper, palladium, platinum, nickel and alloys of any of these metals. It is further preferred that the combination of binders, stabilizers, wetting agents, solvents and fillers are selected so that the metallization densifies at temperatures below 1000° C. Other metals such as palladium, platinum, copper, nickel and alloys thereof may be added to the metallization. These metals may be added to the metallization so that the metallization densifies at temperatures between 1000° C. and 1200° C. and to promote good adhesion to the ceramic substrate.

The compositions of several metallizations, labeled "76B", "76C", "77C", "77A" and "120D", are shown in FIG. 3. Compositions "76B" and "76C" are two metallizations used for top layer and internal conductor patterns, respectively. In the case of composition "76B", a small amount of copper and bismuth oxides is added to assist in adhesion to the ceramic. Composition "120D" utilizes a different organic vehicle which modifies the printability and micro-drying characteristics of the metallizations. Compositions "77A" and "77C" are used as via fill materials in which small amounts of crystalline quartz are used to assist in the adhesion of the metal to the ceramic via wall.

Figure 4:
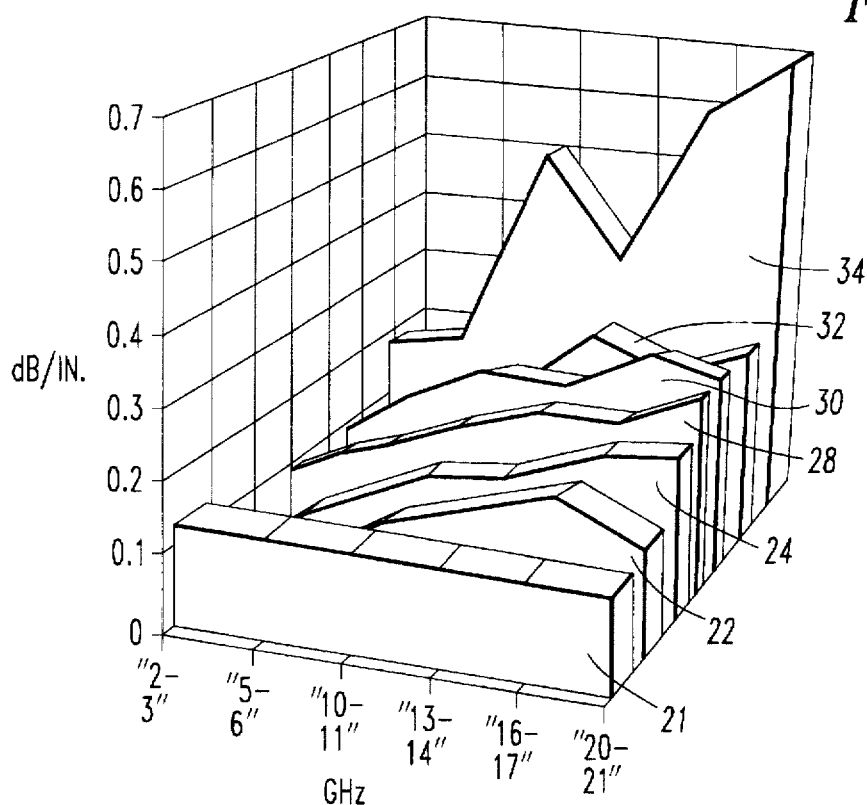
FIG. 4 is a graphical representation of insertion loss versus frequency for a number of metallization materials, each applied on the same ceramic substrate for a fair comparison.

A graphical representation of the microwave insertion losses over frequency for the "76B" and "76C" compositions is shown in FIG. 4. The preformance of the metallizations of FIG. 4, except where noted, were each measured on the same type of substrate, i.e., one having a dielectric constant, $\epsilon_r$, of 3.8 and a loss tangent, $Tan^\delta$ of 0.0007. The insertion loss goal at 10 GHz is shown as 21 and for simplicity is depicted as constant for the range of frequencies. The plottings shown in FIG. 4 as 22 and 24 represent the compositions labeled "76C" and "76B", respectively, in FIG. 3. The composition shown as 28 is a DuPont gold paste that contains spheres of many different sizes (which metallizations is known commercially as "5731 Spherical". In the comparison of FIG. 4, this metallization 28 was tested on a substrate of 99.5% alumina. Since alumina has a different dielectric constant that the substrate that was used for the remainder of the metallizations, and since insertion losses may depend somewhat on the dielectric constant of the substrate, it is noted that on this graph the metallization 28 was applied on a 99.5% alumina substrate. The composition shown as 32 is also a DuPont gold paste containing spheres of many different sizes (which metallization is known commercially as "5731 Spherical"). The composition shown as 34 is also a commercially available gold paste available from DuPont (known commercially as "5717 Irregular") containing nonspherical (i.e., irregularly-shaped) gold paste. The composition shown as 30 is a paste containing non-spherical (i.e., irregularly-shaped) gold made by DuPont (which metallization is known commercially as "34B Irregular").

Figure 5:
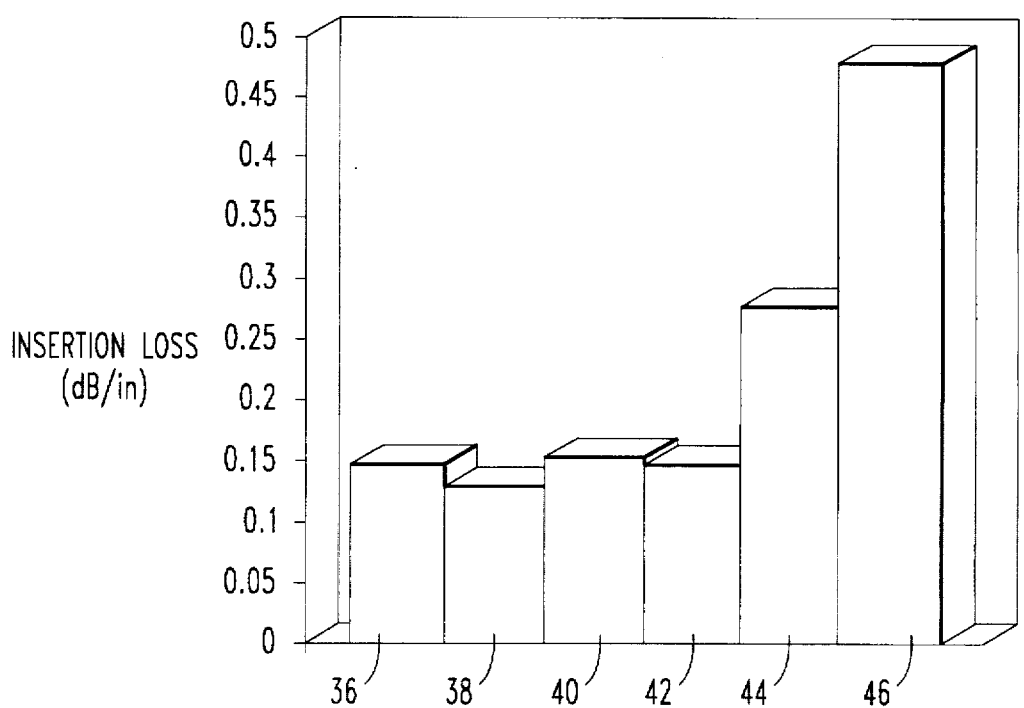
FIG. 5 is a graphical representation of insertion loss at a fixed frequency of 10 GHz for a number of metallization materials, each applied on the same ceramic substrate for a fair comparison.

A comparison of the microwave insertion losses at 10 GHz for the various metallization compositions is shown in FIG. 5. The graphical value 36 represents the goal which was sought to be attained for the metallizations. The metallizations of FIG. 5 were each measured on the same type of substrate, i.e., one having a dielectric constant, $\epsilon_r$, of 3.8 and a loss tangent, $Tan^\delta$, of 0.0005. In FIG. 5, the graphical values 40, 42 represent the metallizations labeled "76C" and "76B", respectively, in FIG. 3. The thin film metallization is pure gold that is vapor deposited in a vacuum system. The metallization designated as 44 is a commercially available gold paste available from Ferro Corporation. The metallization designated as 46 is a commercially available gold paste available from DuPont Corporation.

The presently preferred metallization displays an insertion loss of less than 0.16 dB per inch at 10.0 GHz when applied on a ceramic substrate having a loss tangent of 0.0007.

The superior performance of thick film metallization that incorporates uniformly sized, spherical gold particles is attributable at least in part to the fact that such particles pack into a denser, more highly conductive structure and exhibit a smoother surface texture than irregularly shaped particles. Smoother metal tracks also display a smoother interface with the ceramic, both at the side edges and beneath the metal track. Such smoother interfaces promote low microwave insertion losses.

In addition to lower insertion losses, the presently preferred metallization also provides improved wire bonding strength in bonding to the ceramic. The wire bonding strength of the preferred metallization is in the order of 9 grams of force on a 1 mil (0.001 inch, or 25 microns) wire, whereas most metallizations of the prior art fail at or before 3 grams of force on a 1 mil wire.

It is preferable to use the metallization with ceramic that fires at temperatures of 1000° C. or less, with approximately 980° C. being preferred. Ceramics which fire at these temperatures are preferred because as such temperatures may help the gold to better densify. Although these firing temperatures are preferred, any temperature up to the melting point of gold (i.e., approximately 1063° C.) may be used.

While certain present preferred embodiments have been shown and described, it is distinctly understood that the invention is not limited thereto but may be otherwise embodied within the scope of the following claims.

We claim:

1. A thick film metallization for use in microwave devices comprising monosized, spherical metal particles in an organic vehicle.

2. The metallization of claim 1 further comprising at least one adhesion-promoting additive selected from the group consisting of quartz, copper oxide, bismuth oxide, rhodium and ceramic substrate constituents.

3. The metallization of claim 1 wherein the metal particles are made of at least one material selected from the group consisting of gold, silver, copper, palladium, platinum, nickel and alloys thereof.

4. The metallization of claim 3 wherein the metal particles each have the same diameter, the particular diameter being selected from the range of between 0.3 and 10 microns.

5. The metallization of claim 4 in which the metal particle have a diameter of approximately 1.5 microns.

6. The metallization of claim 1 wherein the metallization is applied to the microwave device as a thick film paste.

7. The metallization of claim 6 wherein the thick film paste is applied by screen printing techniques.

8. The metallization of claim 6 wherein the thick film paste contains a selected combination of organic binders, stabilizers, wetting agents, solvents, and decomposable organic fillers that are selected to provide a viscosity suitable for screen printing and to modify shrinkage behavior of the paste.

9. The metallization of claim 8 wherein the combination of binders, stabilizers, wetting agents, solvents and fillers are selected so that the metallization densifies at temperatures below 1000° C.

10. The metallization of claim 8 further comprising at least one metal selected from the group of metals consisting of palladium, platinum, copper, nickel and alloys thereof.

11. The metallization of claim 10 wherein metals are selected so that the metallization densifies at temperatures between 1000° C. and 1200° C.

* * * * *